United States Patent [19]
Hori

[11] Patent Number: 5,438,298
[45] Date of Patent: Aug. 1, 1995

[54] AMPLIFIER HAVING OVERSHOOT PREVENTING CIRCUIT

[75] Inventor: Hidetoshi Hori, Tokyo, Japan

[73] Assignee: NEC Corporation, Tokyo, Japan

[21] Appl. No.: 180,842

[22] Filed: Jan. 12, 1994

[30] Foreign Application Priority Data

Jan. 14, 1993 [JP] Japan .................................. 5-004466

[51] Int. Cl.⁶ .............................................. H03G 9/12
[52] U.S. Cl. ...................................... 330/289; 330/134
[58] Field of Search ............... 330/289, 296, 302, 134; 307/296.1

[56] References Cited

U.S. PATENT DOCUMENTS 5,015,921  5/1991  Carlson et al. ................. 330/134 X Primary Examiner—Steven Mottola
Attorney, Agent, or Firm—Ostrolenk, Faber, Gerb & Soffen

[57] ABSTRACT

An amplifier for reducing an overshoot when an AC current is applied during class "C" amplification includes a transistor used to amplify an AC signal and a device that, just before an AC signal is applied to the transistor, sends a DC current to the transistor. As a result, when the AC signal is applied to the transistor, the junction temperature of the transistor is elevated to substantially the same level as operating junction temperature of the transistor.

5 Claims, 2 Drawing Sheets

AMPLIFIER HAVING OVERSHOOT PREVENTING CIRCUIT

BACKGROUND OF THE INVENTION

The present invention relates to an amplifier using a transistor for amplification and, more particularly, to an amplifier for amplifying an AC signal by class "C" amplification.

It has been customary with an amplifier of the type described to include a transistor for amplifying an AC signal by class "C" amplification, and an input and an output matching circuit for matching respectively the input to and the output from the transistor with respect to impedance. Under the same circuit conditions, the amplification and output power of the conventional amplifier depend mainly on the junction or chip temperature $\theta$ of the transistor. Specifically, the output power increases when the junction temperature $\theta$ is low or decreases when it is high. Therefore, when an AC signal is applied to the amplifier, the amplifier initially produces a great output since the junction temperature $\theta$ of the transistor is substantially equal to the ambient temperature. However, as the junction temperature $\theta$ rises with the elapse of time due to heat generated in the transistor, the output of the amplifier decreases continuously until the temperature elevation (sometimes higher than 100° C.) reaches thermal equilibrium. Let this phenomenon be referred to as an overshoot. The size and duration of the overshoot depend on the rated power of the transistor, the capacity of a radiator, the output power, and so forth. The duration of the overshoot is determined by a thermal time constant and may be as long as several tens of milliseconds to several minutes. The thermal time constant is determined by various parameters including the above-mentioned parameters.

The overshoot broadens the frequency spectrum of an AC signal. Therefore, when the amplifier is implemented as the final stage amplifier of a radio transmitter, the overshoot adversely affects the communication facilities of the other systems. To eliminate this problem, a filter for removing spurious signals have to be added to the output side of the amplifier. Moreover, assume that the output of the amplifier is a signal to be transmitted to a repeater amplifier whose range of input signal levels has little margin, as in satellite communication. Then, the overshoot is apt to saturate the repeater amplifier, thereby obstructing expected communication.

SUMMARY OF THE INVENTION

It is, therefore, an object of the present invention to provide an amplifier free from an overshoot which obstructs communication.

In accordance with the present invention, an amplifier comprises a transistor for amplifying an AC signal, and a bias voltage applying circuit for applying, just before the AC signal is applied to the first transistor, a DC current to the transistor. As a result, when the AC signal is applied to the transistor, the junction temperature of the transistor is elevated to a temperature substantially equal to the operation junction temperature of the transistor.

Also, in accordance with the present invention, an amplifier comprises a transistor for amplifying an AC signal by class "C" amplification, a switch controlled by a carrier application control signal for selectively turning on or turning off the AC signal to be applied to the transistor, a control signal generator for generating, in response to a carrier control signal indicative of the beginning and the end of a duration of amplification of the transistor, a preheat control signal continuing for a predetermined preheating period from the beginning of the carrier control signal, and the carrier application control signal continuing for the duration of amplification from the end of the preheat control signal, and a bias voltage applying circuit for applying a predetermined bias voltage to the base of the transistor while the preheat control signal continues. The composite parameter of the preheating period and bias voltage is selected such that at the end of the preheat control signal, the junction temperature of the transistor is substantially equal to the junction temperature to hold for the duration of amplification.

BRIEF DESCRIPTION OF THE DRAWINGS

The above and other objects, features and advantages of the present invention will become more apparent from the following detailed description taken with the accompanying drawings in which.

DESCRIPTION OF THE PREFERRED EMBODIMENT

Figure 1:
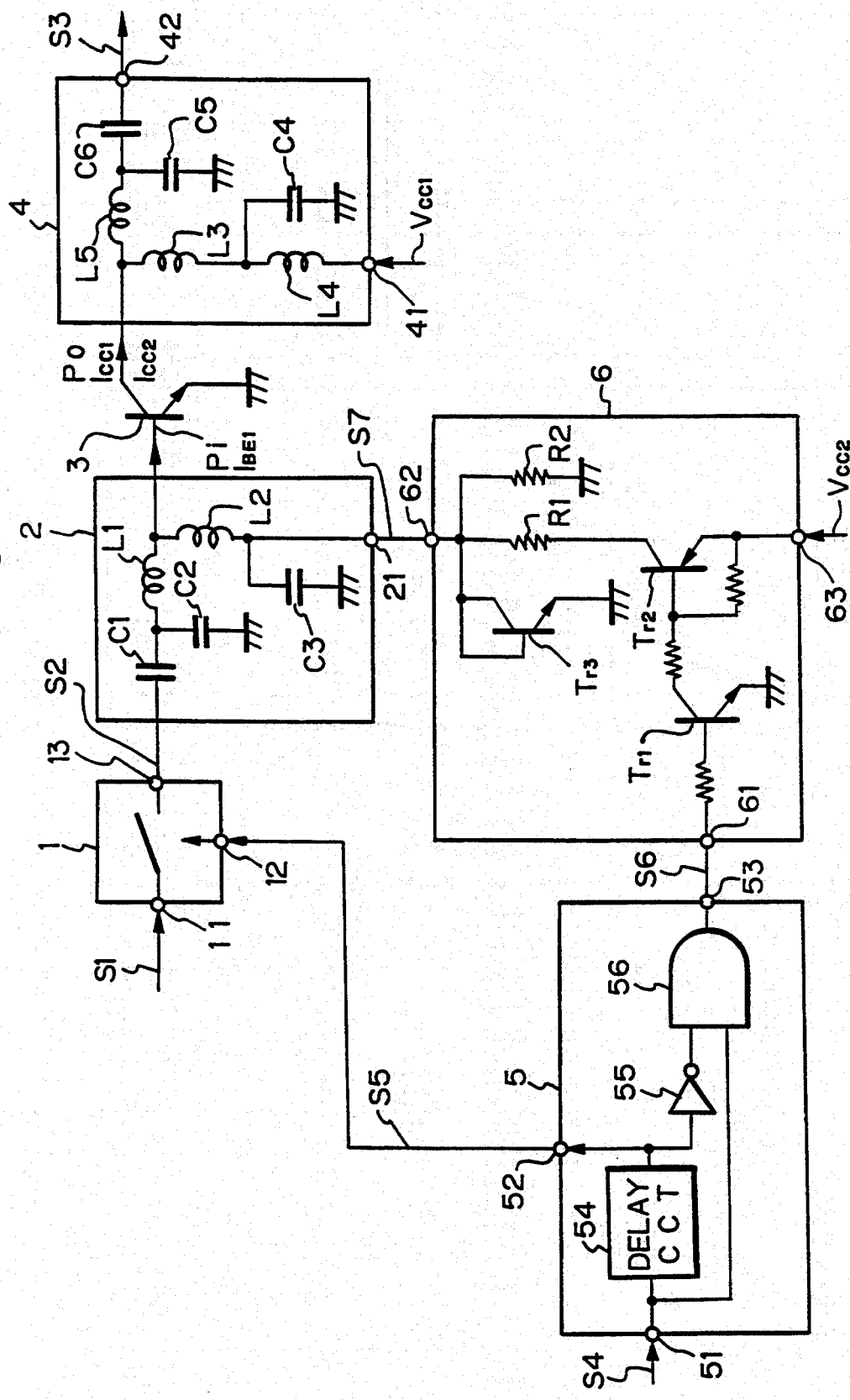
FIG. 1 is a block diagram schematically showing an amplifier embodying the present invention.
Figure 2:
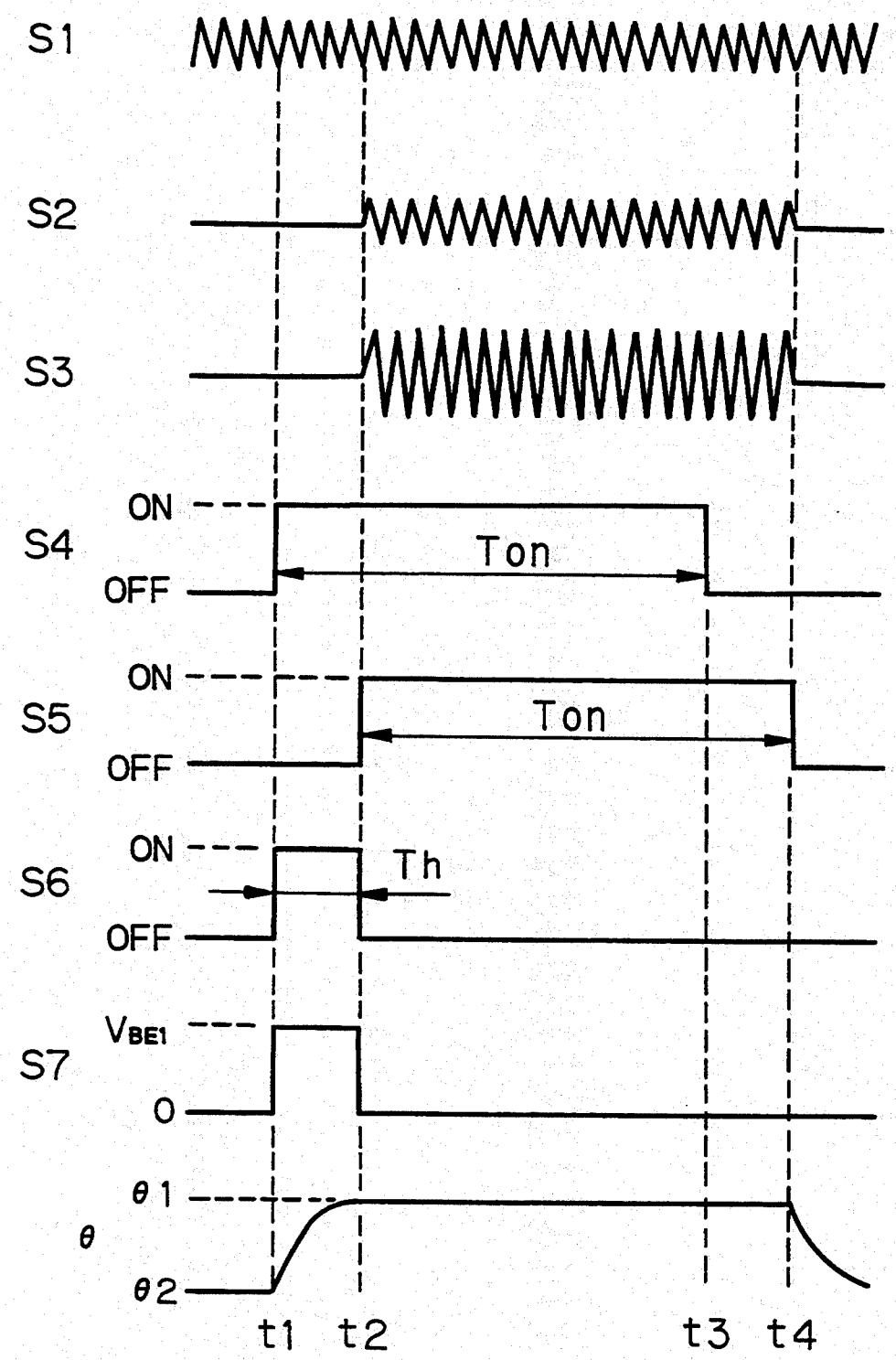
FIG. 2 shows the waveforms of signals appearing in various portions of the circuitry shown in FIG. 1.

Referring to FIG. 1 of the drawings, an amplifier embodying the present invention is shown. FIG. 2 shows the waveforms of signals appearing in the amplifier of FIG. 1. As shown, the amplifier has a diode switch 1 having a terminal 11. An AC signal S1 which has undergone phase modulation or frequency modulation arrives at the terminal 11 of the diode switch 1. The switch 1 includes one or more diodes for turning on and turning off the input AC signal. S1. A control signal generator 5 generates a carrier application control signal S5 and delivers it to the switch 1 via a terminal 12. In response, the switch 1 turns on the AC signal S1 from a time 12 to a time 14, i.e., during an interval Ton. As a result, an AC signal S2 appears on the terminal 13 of the switch 1 only during the operation period of the amplifier, i.e., over the duration of the control signal S5. The AC signal S2 is applied to the base of a transistor 3 via an input matching circuit 2. The input matching circuit 2 includes a filter implemented by capacitors C1, C2 and C3 and inductors L1 and L2 and matches the input impedance of the transistor 3 at the frequency and signal level of the AC signal S2.

Only when the control signal S5 is in a high level or ON state, the transistor 3 amplifies the AC signal S2 by class "C" amplification, thereby outputting an amplified signal on the collector thereof. At this instant, the junction temperature $\theta$ of the transistor is $\theta 1$. A bias applying circuit 6 applies a bias voltage of 0 V to the base of the transistor 3 via the input matching circuit 2, except for a preheating period Th (from a time t1 to the time t2) which will be described later; the transistor 3 remains in a cut-off state before the time t1 and after the time t2. An output matching circuit 4 produces on a terminal 42 thereof an AC signal S3 which is responsive to the amplified signal appearing on the collector of the transistor 3. The output matching circuit 4 includes a filter constituted by capacitors C4, C5 and C6 and inductors L3, L4 and L5 and matches the impedance between the collector of the transistor 3 and an external circuit, not shown, at the frequency and signal level of the AC signal S3. The matching circuit 4 feeds a power source voltage Vcc1 coming in through a terminal 41 thereof to the collector 3 of the transistor 3.

The control signal generator 5 has a terminal 51. The amplifier receives a carrier control signal S4 indicative of the period of time, or operation period of the amplifier, Ton at the terminal 51 of the control signal generator 5. The control signal generator 5 generates a preheat control signal S6 on a terminal 53 thereof from the time t1 to the time t2, i.e., during a preheating period Th and then the carrier application control signal S5 on a terminal 52. The preheat control signal S6 is delivered to the bias applying circuit 6 via a terminal 61. A power source voltage Vcc2 is applied to the bias applying circuit 6 via a terminal 63. During the preheating period Th, the bias applying circuit 6 lowers the voltage Vcc2 to a voltage $V_{BE1}$, i.e., to produce a bias voltage S7 and applies it to the base of the transistor 3 via a terminal 62 thereof and a terminal 21 included in the input matching circuit 2. As a result, a collector current Icc1 flows through the transistor 3 to generate heat. At the time t2 when the preheating period Th expires, the junction temperature $\theta$ of the transistor 3 has risen from the ambient temperature $\theta_2$ to the previously mentioned junction temperature $\theta_1$. The transistor 3, therefore, maintains the same junction temperature $\theta_1$ before and after the time t2 at which the AC signal S2 is applied. It follows that the AC signal S3 appearing on the terminal 42 does not overshoot since the junction temperature $\theta$ of the transistor 3 does not change when the AC signal S2 is applied. It is to be noted that the bias applying circuit 6 sets the base of the transistor 3 at a potential of 0 V before and after the preheating period Th.

In the illustrative embodiment, it may occur that the AC signal S1 begins to be applied at substantially the same time as the carrier control signal S4, i.e., at the time t1. It may also occur that a time t3 when the carrier control signal S4 disappears is coincident with the time at which a device using the amplifier ends operating. In such a case, the amplifier is bodily rendered inactive after the time t3.

How to set the preheating period Th of the transistor 3 will be described hereinafter. Assume that the transistor 3 consumes power P1 during class "C" amplification, that the base input power of the AC signal S2 is Pi, that the power of the amplified signal (AC signal S3) appearing on the collector is Po, that the collector-emitter voltage is Vcc1, and that the collector current is Icc2. Then, the power consumption P1 is expressed as:

$$P1 = Vcc1 \times Icc2 + Pi - Po$$

When the power consumption P1 continues without preheating until the transistor 3 has been brought to thermal equilibrium, the junction temperature $\theta$ of the transistor 3 elevates from a level substantially equal to the ambient temperature $\theta_1$ to $\theta_2$. This elevation time is determined by a thermal time constant relating to the transistor, as stated earlier. On the other hand, assume that the transistor 3 consumes power P2 during preheating, that the collector-emitter voltage is Vcc 1, that the collector current is Icc1, that the base-emitter voltage is $V_{BE1}$, and that the base current is $I_{BE1}$. Then, the power consumption P2 is expressed as:

$$P2 = V_{BE1} \times BE1 + VCC1 \times ICC1$$

It follows that when the power consumption P1 of the transistor 3 during class "C" amplification and the power consumption P2 during preheating are made identical, the preheating period Th of the transistor 3 may be selected to be equal to the period of time in which the transistor 3 reaches thermal equilibrium during class "C" amplification without preheating. In practice, the preheating period Th may, in many cases, be slightly shorter than the period of time in which the transistor 3 reaches thermal equilibrium. Further, when the power consumption P2 is greater than P1, the preheating period Th can be reduced. It is to be noted that determining the preheating period Th by calculation is not practical since complicated thermal equations have to be solved. In this respect, experiments are more convenient than calculation.

The control signal generator 5 will be described more specifically. The carrier control signal S4 input to the terminal 51 is applied to one input of an AND gate 56 and a delay circuit 54. The delay circuit 54 delays the signal S4 by the preheating period Th and feeds the resulting signal, i.e., carrier application control signal S5 to the terminal 52 and an inverter 55. The inverter 55 inverts the signal S5 and applies the resulting signal to the other input of the AND gate 56. The AND gate 56 ANDs the carrier control signal S4 and inverted carrier application control signal S5 and produces the resulting AND, i.e., preheat control signal S6 on the terminal 53 thereof.

The bias applying circuit 6 is constructed as follows. The preheat control signal S6 which is transmitted through the terminal 61 is applied to the base of a transistor Tr1. In response, the transistor Tr1 generates on the collector thereof an inverted signal of the signal S6. The collector of the transistor Tr1 is connected to the base of a transistor Tr2 which receives the power source voltage Vcc2 at the emitter thereof via the terminal 63. The collector of the transistor Tr2 is connected to ground via resistors R1 and R2. The junction between the resistors R1 and R2 is connected to the terminal 62 and the collector of a transistor Tr3. The transistor Tr3 has the collector and base thereof connected and has the emitter connected to ground. In this configuration, a signal of the same polarity as the preheat control signal S4 is generated on the collector of the transistor Tr2. This signal is fed out via the terminal 62 as the previously mentioned bias voltage S7. The bias voltage S7 is limited by the base-emitter voltage $V_{BE1}$ of the transistor Tr3 even when the preheat control signal S6 is in a high level or ON state; when the signal S6 is in a low level or OFF state, it is 0 V since the transistor Tr is turned off. It is noteworthy that when the ambient temperature $\theta_2$ changes, the transistor Tr3 changes the bias voltage $V_{BE1}$ in matching relation to the temperature $\theta_1$ so as to maintain the base current $I_{BE1}$ of the transistor 3 constant.

In summary, a preferred embodiment of the present invention provides an amplifier which feeds, just before the application of an AC signal, a DC current to a transistor used to amplify the AC signal. As a result, when the AC signal is applied to the transistor, the junction temperature of the transistor is elevated to substantially the same level as the operation junction temperature of the transistor. This is successful in eliminating an overshoot due to a change in the junction temperature of the transistor at the time when the AC signal is applied thereto.

Various modifications will become possible for those skilled in the art after receiving the teachings of the present disclosure without departing from the scope thereof.

What is claimed is:

1. An amplifier comprising:
    a first transistor for amplifying an AC signal;
    a bias voltage applying circuit for applying, just before the AC signal is applied to said first transistor, a DC current to said first transistor, whereby when said AC signal is applied to said first transistor, a junction temperature of said first transistor is elevated to a temperature substantially equal to an operating junction temperature of said first transistor;
    a switch controlled by a carrier application control signal for selectively turning on or turning off the AC signal to be applied to said first transistor: and
    a control signal generator for generating, in response to a carrier control signal indicative of a beginning and an end of a duration of amplification of said first transistor, a preheat control signal continuing for a predetermined preheating period from said beginning of said carrier control signal, and said carrier application control signal continuing for said duration of amplification from an end of said preheat control signal;
    said first transistor amplifying the AC signal by class "C" amplification.

2. An amplifier as claimed in claim 1, wherein said first transistor comprises means for applying a predetermined bias voltage to a base of said first transistor while said preheat control signal continues.

3. An amplifier as claimed in claim 2, wherein said predetermined bias voltage comprises a base-emitter voltage of a second transistor included in said bias voltage applying circuit.

4. An amplifier as claimed in claim 2, wherein said control signal generator comprises:
    a delay circuit for delaying said carrier control signal by said preheating period to produce said carrier application control signal;
    an inverter for inverting said carrier application control signal; and
    an AND gate for ANDing said carrier control signal and an inverted carrier application control signal produced by said inverter to thereby produce said preheat control signal.

5. An amplifier comprising:
    a transistor for amplifying an AC signal by class "C" amplification;
    a switch controlled by a carrier application control signal for selectively turning on or turning off the AC signal to be applied to said transistor;
    a control signal generator for generating, in response to a carrier control signal indicative of a beginning and an end of a duration of amplification of said transistor, a preheat control signal continuing for a predetermined preheating period from said beginning of said carrier control signal, and said carrier application control signal continuing for said duration of amplification from an end of said preheat control signal; and
    a bias voltage applying circuit for applying a predetermined bias voltage to a base of said transistor while said preheat control signal continues;
    wherein a composite parameter of said preheating period and said bias voltage is selected such that at the end of said preheat control signal a junction temperature of said transistor is substantially equal to a junction temperature to hold for said duration of amplification.

* * * * *